United States Patent
Kim

(10) Patent No.: US 7,999,294 B2
(45) Date of Patent: Aug. 16, 2011

(54) SEMICONDUCTOR DEVICE WHICH MAY PREVENT ELECTRICAL FAILURES OF CONTACTS

(75) Inventor: Sang-Ho Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 421 days.

(21) Appl. No.: 12/163,131

(22) Filed: Jun. 27, 2008

(65) Prior Publication Data

US 2009/0032954 A1  Feb. 5, 2009

(30) Foreign Application Priority Data

Jul. 31, 2007  (KR) .................... 10-2007-0077009

(51) Int. Cl.
*H01L 21/768* (2006.01)
(52) U.S. Cl. ............... 257/296; 257/E27.087; 257/503; 257/773; 257/774
(58) Field of Classification Search ........... 257/E27.087, 257/503, 773, 774, 296
See application file for complete search history.

(56) References Cited

U.S. PATENT DOCUMENTS

| | | | | |
|---|---|---|---|---|
| 5,142,438 | A | * | 8/1992 | Reinberg et al. ............... 361/313 |
| 5,229,314 | A | * | 7/1993 | Okudaira et al. ............. 438/253 |
| 5,563,089 | A | * | 10/1996 | Jost et al. ...................... 438/396 |
| 6,027,969 | A | * | 2/2000 | Huang et al. .................. 438/254 |
| 6,188,100 | B1 | * | 2/2001 | Hermes ......................... 257/309 |
| 7,037,730 | B2 | * | 5/2006 | Basceri et al. .................... 438/3 |
| 7,126,205 | B2 | * | 10/2006 | Robinson ...................... 257/532 |
| 7,221,020 | B2 | * | 5/2007 | Tran .............................. 257/330 |
| 7,492,004 | B2 | * | 2/2009 | Lee et al. ...................... 257/330 |
| 2002/0072223 | A1 | * | 6/2002 | Gilbert et al. ................. 438/629 |
| 2005/0186743 | A1 | * | 8/2005 | Utsunomiya ................. 438/286 |

FOREIGN PATENT DOCUMENTS

| JP | 10-22478 | 1/1998 |
|---|---|---|
| KR | 2001-0091723 | 10/2001 |
| KR | 2003-0059444 | 7/2003 |

* cited by examiner

*Primary Examiner* — Eugene Lee
(74) *Attorney, Agent, or Firm* — F.Chau & Associates, LLC

(57) ABSTRACT

A semiconductor device includes a first insulation film having a plurality of openings which exposes predetermined regions of a semiconductor substrate, a plurality of first conductive patterns partially filling the openings and a plurality of second conductive patterns disposed on the first conductive patterns within the openings and separated from inner walls of the openings.

11 Claims, 9 Drawing Sheets

SEMICONDUCTOR DEVICE WHICH MAY PREVENT ELECTRICAL FAILURES OF CONTACTS

This application claims priority from Korean Patent Application No. 10-2007-0077009 filed on Jul. 31, 2007, the disclosure of which is hereby incorporated by reference herein in its entirety.

BACKGROUND OF THE INVENTION

1. Technical Field

The present disclosure relates to a semiconductor device and to a method of fabricating the same, and more particularly, to a semiconductor device which can prevent electrical failures of contacts and to a method of fabricating the semiconductor device.

2. Description of the Related Art

Generally, a semiconductor device includes individual devices, such as, for example, a transistor or a capacitor, and wirings connecting the individual devices. In addition, the semiconductor device includes contacts connecting the individual devices to one another, the individual devices to the wirings, or the wirings to one another.

As the integration density of such a semiconductor device rapidly increases, individual devices are becoming smaller. In addition, contacts connecting the individual devices to one another or upper and lower wirings to each other are also becoming smaller. Accordingly, the margin of a region in which the contacts are to be formed is also reduced. Such a reduction in margin due to an increase in integration density may cause electrical failures between the contacts.

SUMMARY OF THE INVENTION

Exemplary embodiments of the present invention provide a semiconductor device which can prevent electrical failures of contacts and a method of fabricating a semiconductor device providing the same.

In accordance with an exemplary embodiment of the present invention, a semiconductor device is provided. The semiconductor device includes a first insulation film having a plurality of openings which exposes predetermined regions of a semiconductor substrate, a plurality of first conductive patterns partially filling the openings and a plurality of second conductive patterns disposed on the first conductive patterns within the openings and separated from inner walls of the openings.

In accordance with an exemplary embodiment of the present invention, a semiconductor device is provided. The semiconductor device includes a first inter-layer insulation film having a plurality of contact holes which exposes predetermined regions of a semiconductor substrate, a plurality of first contact pads partially filling the contact holes, a plurality of second contact pads disposed on the first contact pads within the contact holes and separated from inner walls of the contact holes, and a second inter-layer insulation film disposed on the first inter-layer insulation film. The semiconductor device further includes a plurality of bitlines disposed on the second inter-layer insulation film and electrically connected to the second contact pads and a plurality of contacts formed in the second inter-layer insulation film and electrically connected to the second contact pads between the bitlines.

In accordance with another exemplary embodiment of the present invention, a method of fabricating a semiconductor device is provided. The method includes forming a first inter-layer insulation film on a semiconductor substrate, forming a plurality of contact holes in the first inter-layer insulation film, which expose predetermined regions of the semiconductor substrate, forming a plurality of first contact pads partially filling the contact holes and forming a plurality of second contact pads on the first contact pads within the contact hole, which are separated from inner walls of the contact holes. The method further includes forming a second inter-layer insulation film on the first inter-layer insulation film, forming a plurality of bitlines on the second inter-layer, which are electrically connected to the second contact pads and forming a plurality of contacts in the second inter-layer insulation film, which are electrically connected to the second contact pads between the bitlines.

BRIEF DESCRIPTION OF THE DRAWINGS

Exemplary embodiments of the present invention can be understood in more detail from the following description when taken in conjunction with the attached drawings in which.

DETAILED DESCRIPTION OF THE EXEMPLARY EMBODIMENTS OF THE INVENTION

Figure 1:
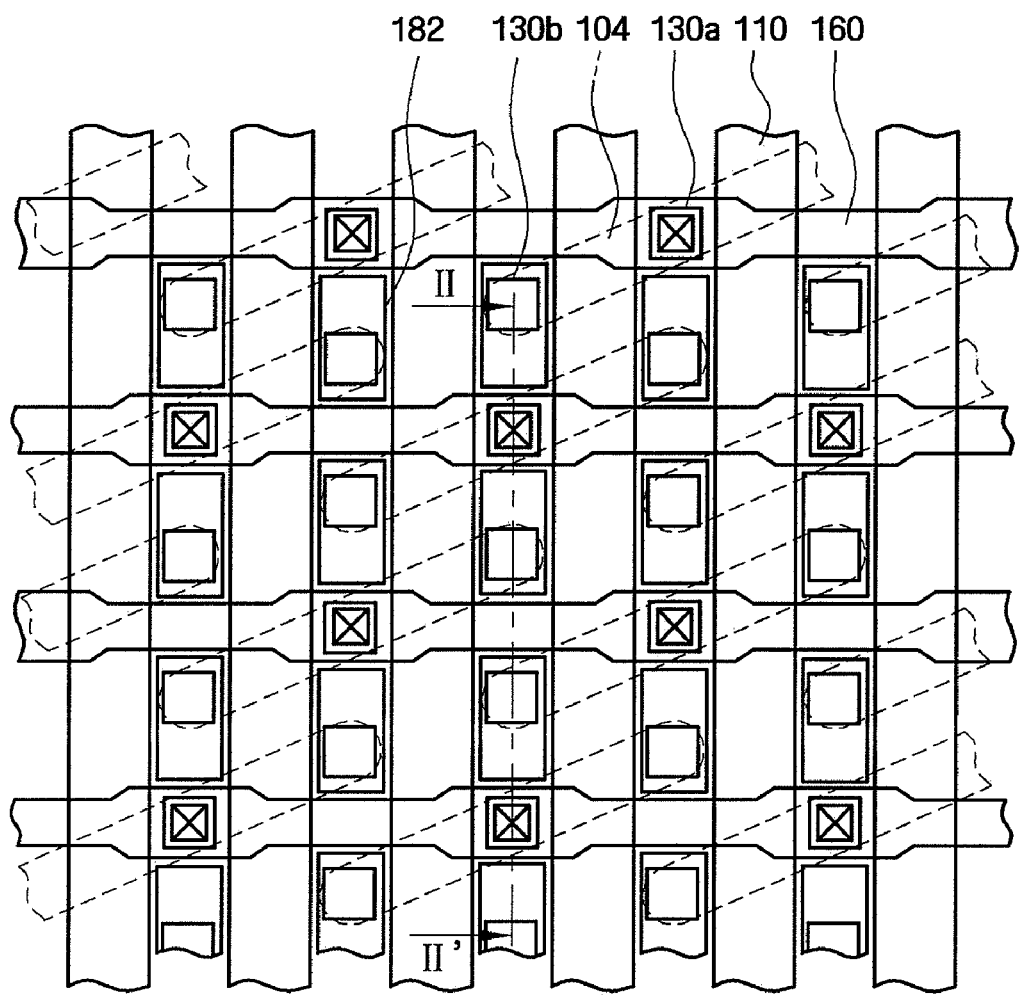
FIG. 1 is a layout of a semiconductor device according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

The structure of a semiconductor device according to an exemplary embodiment of the present invention will now be described with reference to FIGS. 1 and 2.

FIG. 1 is a layout of a semiconductor device according to an exemplary embodiment of the present invention. FIG. 2 is a cross-sectional view of the semiconductor device taken along a line II-II' of FIG. 1.

Figure 2:
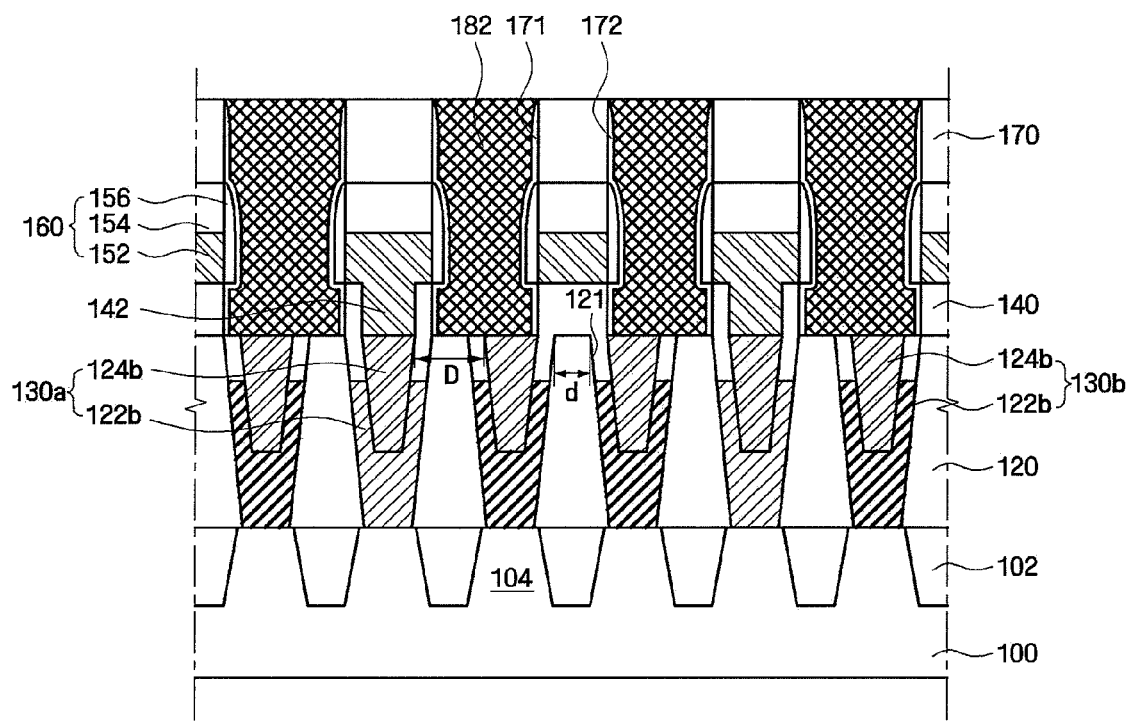
FIG. 2 is a cross-sectional view of the semiconductor device taken along a line II-II' of FIG. 1.

Referring to FIGS. 1 and 2, an active region 104 of a semiconductor substrate 100 is defined by a device isolation film 102, and a plurality of gate lines 110 extend on the semiconductor substrate 100 in one direction. In addition, impurity regions are formed in the active region 104 on both sides of each of the gate lines 110.

A first inter-layer insulation film 120 having a plurality of contact holes 121, which expose the active region 104 between the gate lines 110, is disposed on the gate lines 110. In addition, contact pads 130a and 130b are formed in the contact holes 121 of the first inter-layer insulation film 120.

For example, each of the contact pads 130a and 130b may be composed of first and second contact pads 122b and 124b, and the second contact pad 124b may be inserted into the first contact pad 122b.

That is, the first contact pad 122b contacts the active region 104 of the semiconductor substrate 100 and is conformally formed along inner walls of each of the contact holes 121. The first contact pad 122b contacting the inner walls of each of the contact holes 121 may be self-aligned with each of the gate lines 110. An upper part of the first contact pad 122b is recessed from a surface of the first inter-layer insulation film 120. In addition, a central part of the first contact pad 122b may contact a lower part of the second contact pad 124b.

The second contact pad 124b may be formed on the first contact pad 122b and have its lower part inserted into the first contact pad 122b. A surface of the second contact pad 124b is on the same plane as that of the first inter-layer insulation film 120. In addition, upper sidewalls of the second contact pad 124b are separated from the inner walls of each of the contact holes 121 of the first inter-layer insulation film 120. Therefore, a second inter-layer insulation film 140 may be formed on the recessed first contact pad 122b to surround the second contact pad 124b. That is, the second inter-layer insulation film 140 may be interposed between each of the contact holes 121 and the second contact pad 124b in an upper region of the first inter-layer insulation film 120.

The first and second contact pads 122b and 124b may be made of different materials. For example, the first contact pad 122b may be made of polysilicon, and the second contact pad 124b may be made of a metal material. In this case, a barrier film may be disposed on an interface between the first and second contact pads 122b and 124b to prevent diffusion of the metal material into the first contact pad 122b and reduce contact resistance. The metal material that forms the second contact pad 124b may be, for example, tungsten (W), copper (Cu) or aluminum (Al), and the barrier film may be made of any one of, for example, tantalum nitride (TaN), tantalum silicon nitride (TaSiN), titanium (Ti), titanium nitride (TiN), titanium silicon nitride (TiSiN), tungsten (W) and tungsten nitride (WN), or a combination of the same. For example, the barrier film may be a Ti/TiN film, and a metal film may be a W film. Accordingly, a metal silicide film may be disposed on the interface between the first and second contact pads 122b and 124b.

As described above, the contact pad 130a or 130b, which is composed of the first and second contact pads 122b and 124b, is formed in each of the contact holes 121 of the first inter-layer insulation film 120. The contact pad 130a, that is, a bitline contact pad, may be electrically connected to each bitline 160 thereabove, and the contact pad 130b, that is, a storage node contact pad, may be electrically connected to each storage node thereabove.

In the upper region of the first inter-layer insulation film 120, a distance d between the contact holes 121 is greater than a distance D between the second contact pads 124b of the contact pads 130a and 130b. In addition, the second inter-layer insulation film 140 may be interposed between the contact holes 121 and the second contact pads 124b. Accordingly, an insulation margin between the contact pads 130a and 130b can be secured on a plane of the first inter-layer insulation film 120.

The second inter-layer insulation film 140 is disposed on the first inter-layer insulation film 120 which includes the contact pads 130a and 130b, each having the first and second contact pads 122b and 124b. The second inter-layer insulation film 140 extends into the contact holes 121 from the surface of the first inter-layer insulation film 120, surrounds the second contact pads 124b, and is disposed on the first contact pads 122b.

In addition, the second inter-layer insulation film 140 includes bitline contact holes 141 (see FIG. 8) exposing the bitline contact pads, e.g., the contact pads 130a, thereunder, and contact spacers made of nitride may be formed on inner walls of each of the bitline contact holes 141. A bitline contact plug 142 made of a conductive material is formed in each of the bitline contact holes 141.

The bitlines 160 are formed on the bitline contact plugs 142 and extend perpendicular to the gate lines 110 on the semiconductor substrate 100. Each of the bitlines 160 includes a conductive pattern 152 and a capping film pattern 154 stacked sequentially, and bitline spacers 156 are formed on both sides of the conductive pattern 152 and the capping film pattern 154. The conductive patterns 152 may be made of a material identical to that of the bitline contact plugs 142 thereunder.

A third inter-layer insulation film 170 is disposed on the bitlines 160, and storage node contact holes 171 exposing the storage node contact pads, e.g., the contact pads 130b, thereunder are formed in the second and third inter-layer insulation films 140 and 170 between the bitlines 160.

Contact spacers 172 are formed in each of the storage node contact holes 171 to provide electrical insulation from the bitlines 160 and the bitline contact plugs 142. The storage node contact holes 171 may become wider in the direction of the bitlines 160 to increase the contact area with the storage node contact pads 130b.

A storage node contact plug 182 made of a conductive material is formed in each of the storage node contact holes 171. Here, the storage node contact plugs 182 contacts the storage node contact pads, e.g., the contact pads 130b, thereunder. A lower cross-section of each of the storage node contact plugs 182 may be greater than an upper cross-section of each of the contact pads 130b.

Due to misalignment of the bitlines 160, the storage node contact plugs 182 may be disposed a short distance away from the bitline contact plugs 142. That is, the storage node contact plugs 182 may be disposed adjacent to the bitline contact plugs 142, up to the upper parts of the first contact pads 122b of the contact pads 130a. However, as the distance D between the second contact pads 124b of the contact pads 130a and 130b is greater than the distance d between the contact holes 121, an electric short circuit between the storage node contact plugs 182 and the underlying contact pads 130a can be prevented. In addition, as part of the second inter-layer insulation film 140 is interposed between the second contact pads 124b separated from the inner walls of the contact holes 121 and the contact holes 121, an insulation margin between the contact pads 130a and 130b and the contact plugs 142 and 182 thereabove can be secured.

Hereinafter, a method of fabricating a semiconductor device according to an exemplary embodiment of the present invention will be described in detail with reference to FIGS. 1 through 11. FIGS. 3 through 11 are cross-sectional views for explaining processes included in a method of fabricating a semiconductor device according to an exemplary embodiment of the present invention.

Figure 3:
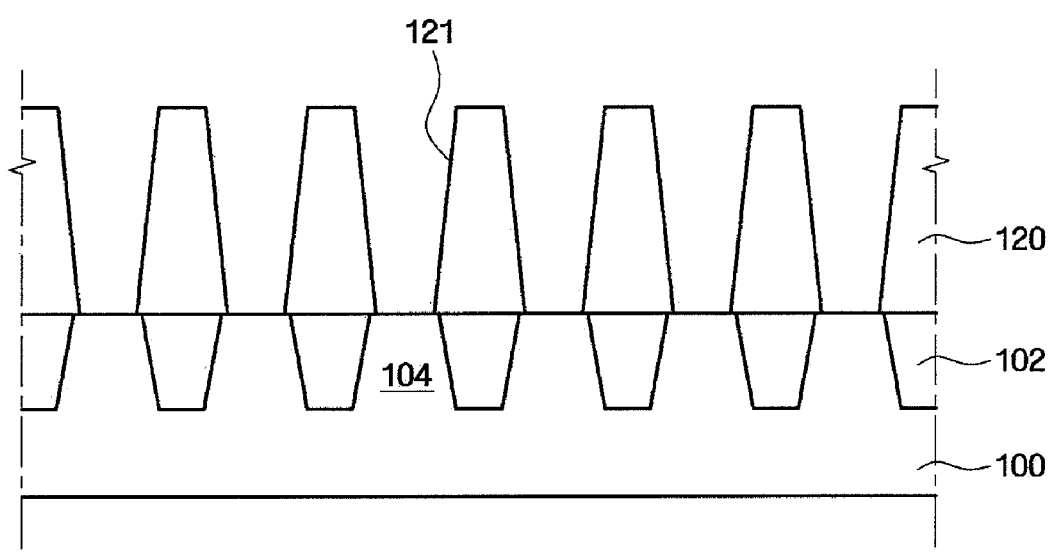
FIGS. 3 through 11 are cross-sectional views for explaining processes included in a method of fabricating a semiconductor device according to an exemplary embodiment of the present invention.

Referring to FIG. 3, a device isolation film 102 is formed in a semiconductor substrate 100 through, for example, a location oxidation of silicon (LOCOS) or shallow trench isolation process, thereby defining an active region 104 of the semiconductor substrate 100.

Next, a plurality of gate lines 110 extending across the active region 104 in one direction are formed on the semiconductor substrate 100 having the active region 104 defined. A gate insulation film, a gate conductive film, and a gate capping film may be stacked on the semiconductor substrate 100 and then patterned. Thereafter, spacers may be formed on both sidewalls of the resultant structure, thereby completing the gate lines 110.

Next, impurities are injected into the active region 104 on both sides of the gate lines 110 using the gate lines 110 as ion implantation masks. Accordingly, impurity regions are formed. Consequently, a conventional transistor is completed.

An insulating material is deposited on a whole surface of the semiconductor substrate 100 having the gate lines 110 thereon. Then, for example, a chemical mechanical polishing (CMP) process or an etch-back process is performed on the insulating material to planarize an upper part of the insulating material. Consequently, a first inter-layer insulation film 120 is formed. The first inter-layer insulation film 120 may be, for example, a silicon oxide film such as a borosilicate glass (BSG) film, a phosphosilicate glass (PSG) film, a borophosphosilicate glass (BPSG) film, a plasma enhanced-tetra ethyl ortho silicate (PE-TEOS) film, or a high density plasma (HDP) film.

A conventional photolithography process is performed on the first inter-layer insulation film 120 to form contact holes 121 which expose the active region 104 within the semiconductor substrate 100. When the contact holes 121 are formed, if the first inter-layer insulation film 120 is etched using an etching gas which has high etching selectivity for the gate lines 110, the contact holes 121 may be self-aligned with the gate lines 110, thereby exposing the impurity regions in the semiconductor substrate 100.

Figure 4:
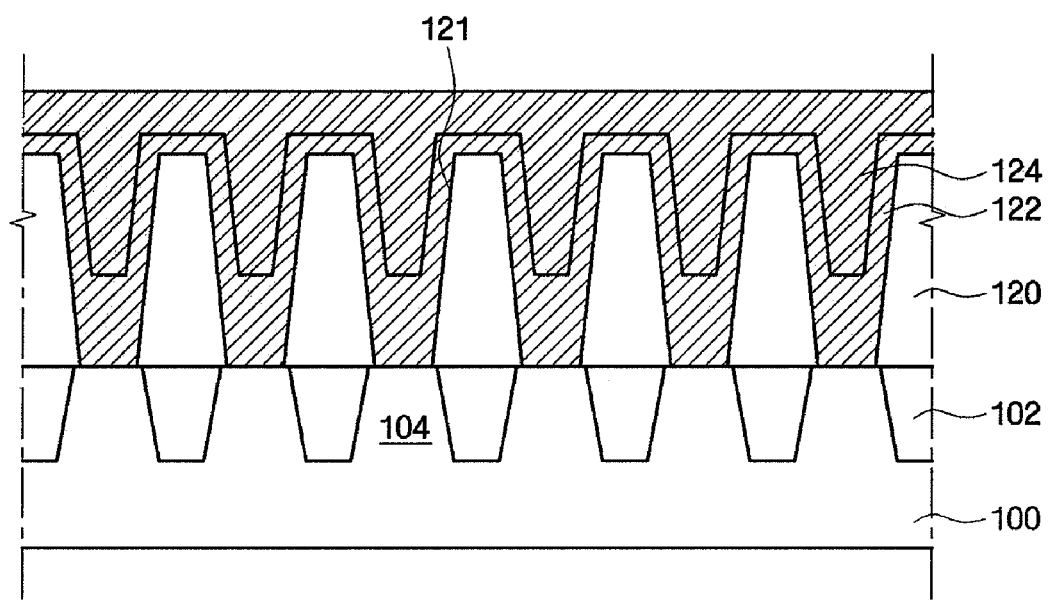

Referring to FIG. 4, a first conductive film 122 is conformally formed on the first inter-layer insulation film 120 having the contact holes 121 and along inner walls of the contact holes 121. The first conductive film 122 may be conformally formed within the contact holes 121 through a deposition process such as, for example, a chemical vapor deposition (CVD) process or an atomic layer deposition (ALD) process. In this case, the first conductive film 122 fills part of each of the contact holes 121 but does not completely bury each of the contact holes 121. The thickness of the first conductive film 122 formed here determines the distance between second contact pads 124a (see FIG. 6) which will be formed in a subsequent process. Furthermore, the thickness of the first conductive film 122 may determine an insulation margin between storage node contact plugs 182 (see FIG. 11) and contact pads 130a (see FIG. 6). The first conductive film 122 may be made of, for example, a conductive material doped with high-concentration impurities, such as polysilicon.

A second conductive film 124 is formed on the first conductive film 122 to a thickness sufficient to completely bury the contact holes 121. The second conductive film 124 may be formed in a deposition process such as, for example, the CVD process or the ALD process and may be made of a conductive material different from that of the first conductive film 122. For example, the second film 124 may be formed of a metal material such as W, Al or Cu. If the second conductive film 124 is to be made of a metal material, a barrier film may be conformally formed along a surface of the first conductive film 122 before the second conductive film 124 is formed. The barrier film can prevent diffusion of the metal material and reduce contact resistance before a metal film is formed. The barrier film may be made of any one of, for example, TaN, TaSiN, Ti, TiN, TiSiN, W and WN, or a combination of the same.

When the first conductive film 122 and the second conductive film 124 are formed as described above, a silicide film may be formed on an interface between the first conductive film 122 and the second conductive film 124 due to reaction between silicon and the metal material.

Figure 5:
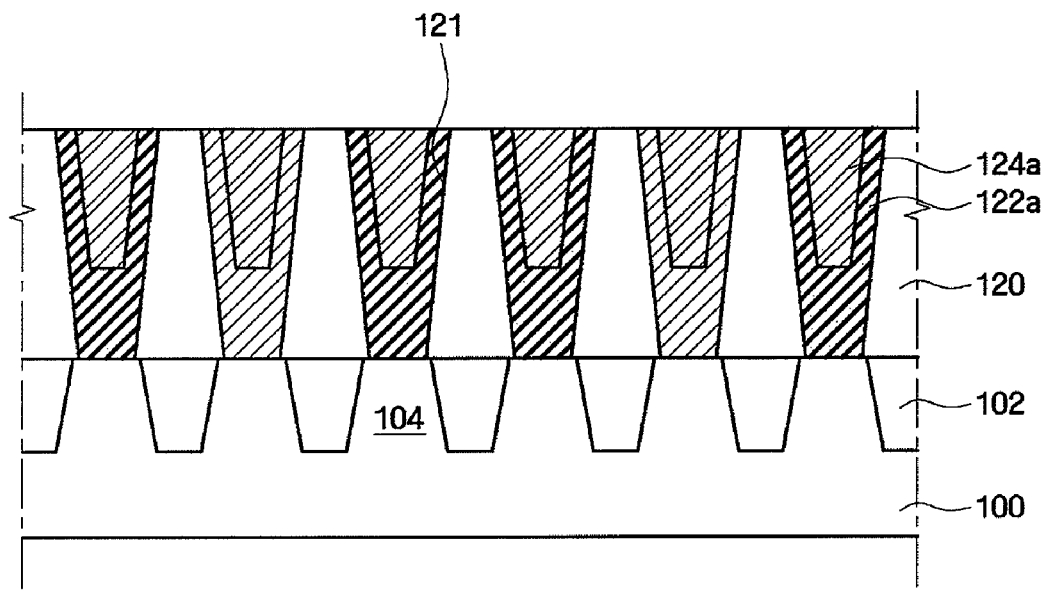

Referring to FIG. 5, the first and second conductive films 122 and 124 are planarized. That is, the first and second conductive films 122 and 124 are sequentially planarized until a surface of the first inter-layer insulation film 120 is exposed. In this case, the planarization process may be, for example, the CMP process or the etch-back process. Accordingly, a first conductive pattern 122a and a second conductive pattern 124a are formed in each of the contact holes 121 of the first inter-layer insulation film 120. As the first and second conductive patterns 122a and 124a are formed in the planarization process, top surfaces of the first inter-layer insulation film 120 and the first and second conductive patterns 122a and 124a may be on the same plane.

Figure 6:
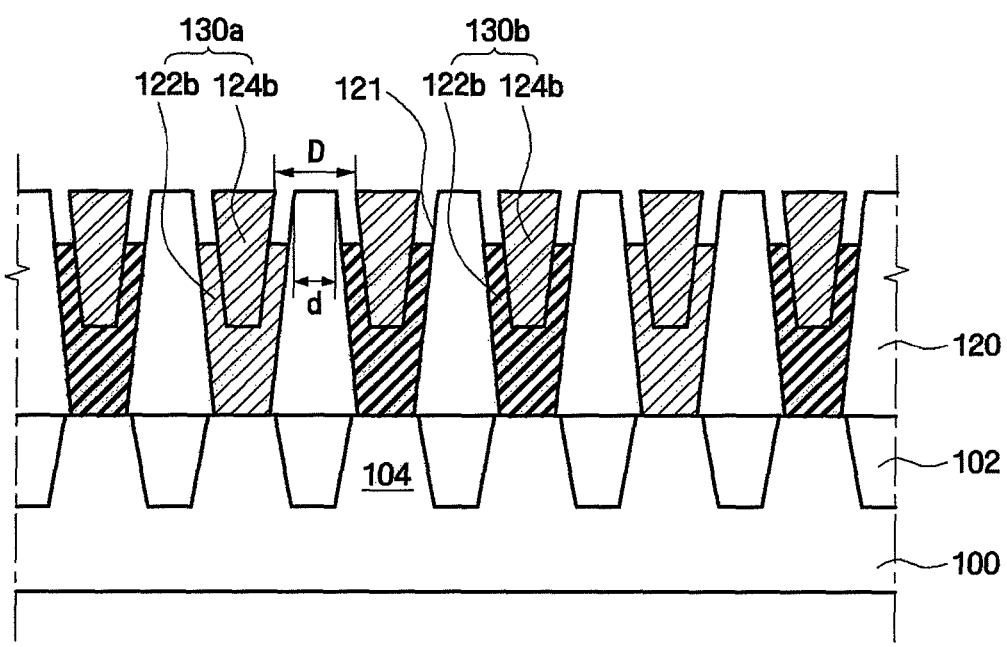

Referring to FIG. 6, in a state where the first and second conductive patterns 122a and 124a are on the same plane, the first conductive pattern 122a is recessed into each of the contact holes 121. Consequently, first and second contact pads 122b and 124b are formed.

For example, in a state where the first inter-layer insulation film 120 and the first and second conductive patterns 122a and 124a are on the same plane, an upper part of the first conductive pattern 122a is selectively removed. In this case, as the first and second conductive patterns 122a and 124a are made of different materials, the first conductive pattern 122a may be selectively etched and thus recessed into each of the contact holes 121.

That is, the first conductive pattern 122a is anisotropically etched into each of the contact holes 121 to a predetermined depth, thereby completing the first contact pad 122b. At the same time as the completion of the first contact pad 122b, upper sidewalls of the second conductive pattern 124a are exposed, thereby completing the second contact pad 124b. Here, the top surface of the second conductive pattern 124a may be maintained on the same plane as that of the first inter-layer insulation film 120.

That is, the first contact pads 122b partially filling the contact holes 121 in the first inter-layer insulation film 120 are formed. In addition, the second contact pads 124b whose lower parts are inserted into the first contact pads 122b and whose upper sidewalls are separated from the inner walls of the contact holes 121 are formed. Accordingly, contact pads 130a and 130b, each composed of the first and second contact pads 122b and 124b, are formed in the contact holes 121 of the first inter-layer insulation film 120. A distance D between the second contact pads 124b of the contact pads 130a and 130b may be greater than a distance d between the contact holes 121.

As the contact pads 130a and 130b are separated from each other on the surface of the first inter-layer insulation film 120 by the distance D between the second contact pads 124a, an insulation margin between the contact pads 130a and 130b can be secured. The distance D between the second contact pads 124a may be readily adjusted by controlling the thickness of the first conductive film 122 (see FIG. 4) when the first conductive film 122 is deposited.

That is, if the first contact pads 122b formed in the contact holes 121 are not recessed, the distance between the contact pads 130a and 130b may be reduced. However, as the first contact pads 122b are recessed, the distance between the contact pads 130a and 130b on the surface of the first inter-layer insulation film 120 can be increased. That is, the contact pads 130a and 130b formed in the first inter-layer insulation film 120 may be separated from each other on the surface of the first inter-layer insulation film 120 by the distance D between the second contact pads 124b.

In addition, each of the contact pads 130a and 130b, which is composed of the first and second contact pads 122b and 124b, may be classified as a bitline contact pad or a storage node contact pad according to a subsequent process.

Figure 7:
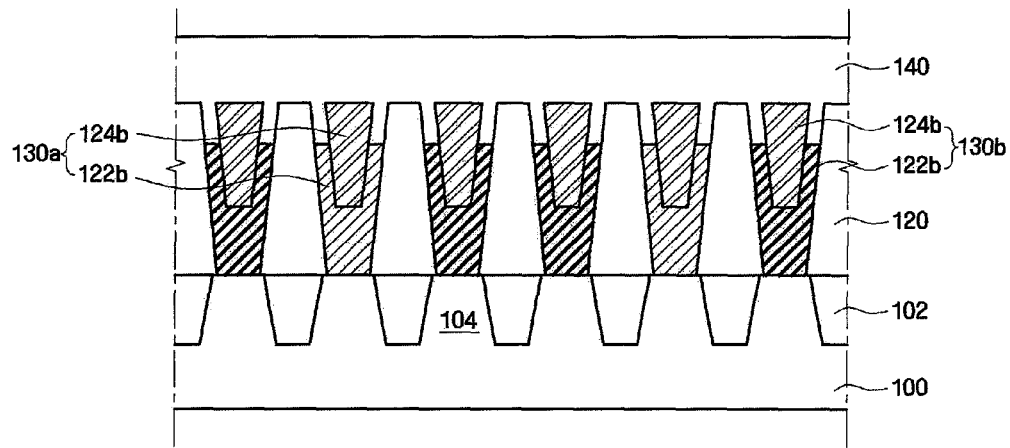

Referring to FIG. 7, a second inter-layer insulation film 140 is formed on the first inter-layer insulation film 120 having the contact pads 130a and 130b. The second inter-layer insulation film 140 may be formed in a deposition process such as, for example, the CVD process or the ALD process. The second inter-layer insulation film 140 may be, for example, a silicon oxide film such as a BSG film, a PSG film, a BPSG film, a PE-TEOS film, or an HDP film. After the second inter-layer insulation film 140 is deposited, its upper part may be planarized.

When the second inter-layer insulation film 140 is formed, an insulating material of the second inter-layer insulation film 140 may fill the recessed upper parts of the first contact pads 122b. Therefore, the second inter-layer insulation film 140 surrounds the second contact pads 122b.

Figure 8:
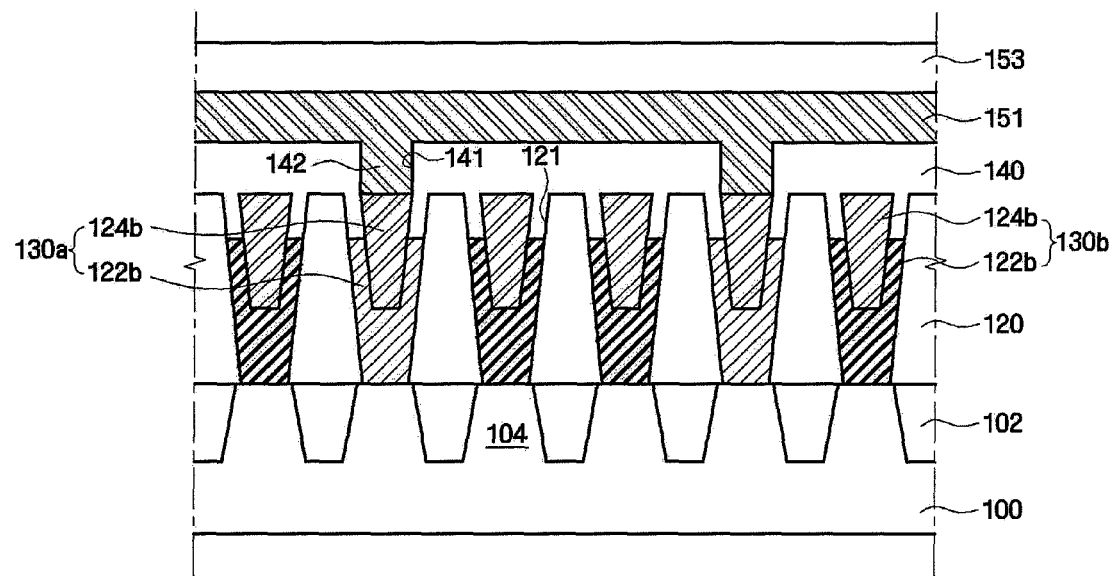

Referring to FIG. 8, a conventional photolithography process is performed on the second inter-layer insulation film 140 to form bitline contact holes 141 exposing surfaces of the bitline contact pads, e.g., the contact pads 130a, thereunder. After the bitline contact holes 141 are formed, contact spacers may be formed on inner walls of the bitline contact holes 141 for electrical insulation. The contact spacers may be formed on the inner walls of the bitline contact holes 141 by conformally depositing a nitride film along the surfaces of the bitline contact holes 141 and etching back the nitride film.

Then, a conductive material may be filled into the bitline contact holes 141 to form bitline contact plugs 142. Here, the conductive material is formed to a thickness sufficient to reach the upper part of the second inter-layer insulation film 140 and then planarized, thereby forming a bitline conductive film 151. The bitline contact plugs 142 and the bitline conductive film 151 may be made of the same material as that of the second contact pads 124b thereunder. That is, the bitline contact plugs 142, the bitline conductive film 151, and the second contact pads 124b may be formed by depositing a metal material such as, for example, W, Al or Cu. By forming the second contact pads 124b and the bitline contact plugs 142 of the same material, contact resistance between the second contact pads 124b and the bitline contact plugs 142 can be reduced.

After the bitline conductive film 151 is formed, a nitride film is deposited on the bitline conductive film 151 to form a bitline capping film 153.

Figure 9:
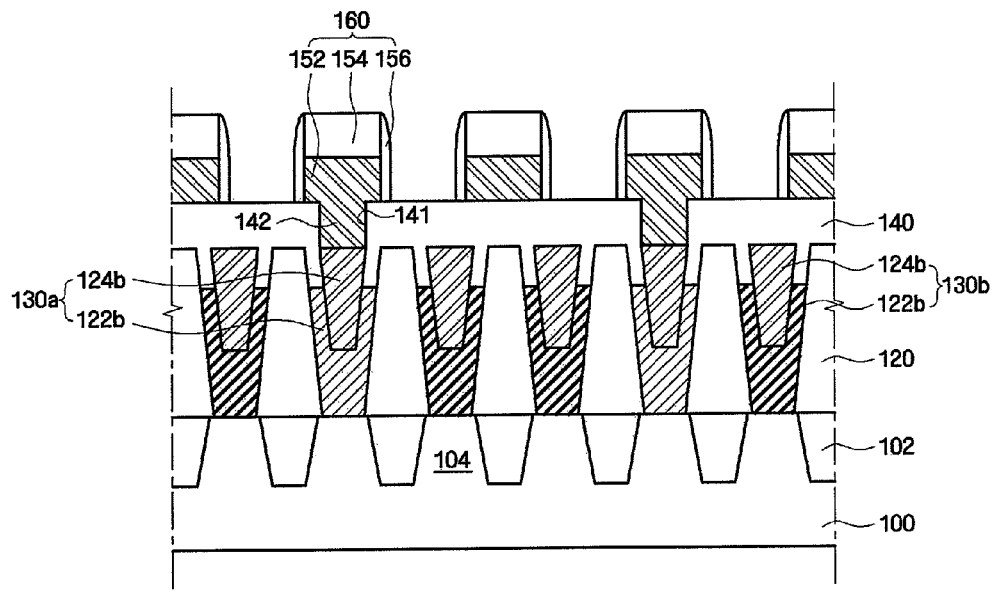

Referring to FIG. 9, the bitline capping film 153 and the bitline conductive film 151 are patterned to form bitlines 160. Each of the bitlines 160 includes bitline spacers 156 on both sidewalls of a bitline conductive pattern 152 and a bitline capping pattern 154. The bitline spacers 156 may be formed by patterning the bitline capping pattern 154 and the bitline conductive pattern 152, depositing a nitride film on whole surfaces of the patterned bitline capping pattern 154 and the patterned bitline conductive pattern 152, and etching back the deposited nitride film. The bitlines 160 extend perpendicular to the gate lines 110 thereunder and are electrically connected to the contact pads 130a by the bitline contact plugs 142.

Figure 10:
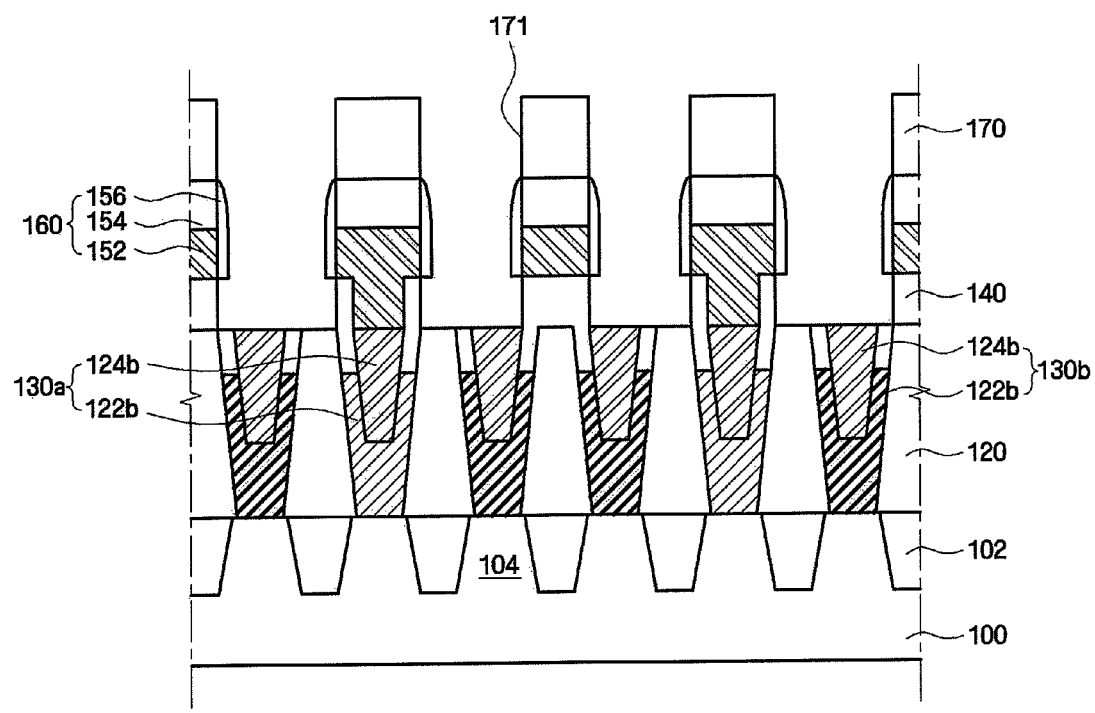

Referring to FIG. 10, an insulating material burying the bitlines 160 is deposited on the second inter-layer insulation film 140 and then planarized to form a third inter-layer insulation film 170. The third inter-layer insulation film 170 may be, for example, a silicon oxide film such as a BPSG film, a PE-TEOS film, or an HDP film.

Next, a conventional photolithography process is performed on the third and second inter-layer insulation films 170 and 140 to form storage node contact holes 171 exposing surfaces of the storage node contact pad, e.g., the contact pads 130b.

For example, a mask pattern is formed on the third inter-layer insulation film 170 to expose the contact pads 130b thereunder. The second and third inter-layer insulation films 140 and 170 are anisotropically etched using the mask pattern, thereby forming the storage node contact holes 171 that expose the surfaces of the contact pads 130b. The storage node contact holes 171 may be formed by etching the second and third inter-layer insulation films 140 and 170 between the bitlines 160.

When the storage node contact holes 171 are formed as described above, if the bitlines 160 or the storage node contact holes 171 are misaligned, the storage node contact holes 171 may expose the upper parts of the first contact pads 122b of the contact pads 130a.

In addition, as each of the storage node contact holes 171 formed by the anisotropic etching process has a high aspect ratio, it may become narrower toward a lower part thereof. Accordingly, to expand diameters of the storage node contact holes 171, the storage node contact holes 171 may be isotropically etched after being anisotropically etched. In this case, the storage node contact holes 171 may also expose the upper parts of the first contact pads 122b of the contact pads 130a.

Even if the storage node contact holes 171 expose the upper parts of the first contact pads 122b of the contact pads 130a, the leakage of the conductive material of the contact pads 130a can be prevented. That is, as each of the contact pads 130a and 130b is composed of the first and second contact pads 122b and 124b, an insulation margin between the contact pads 130a and 130b is secured. Therefore, the leakage of the conductive material of the contact pads 130a by the storage node contact holes 171 can be prevented.

Figure 11:
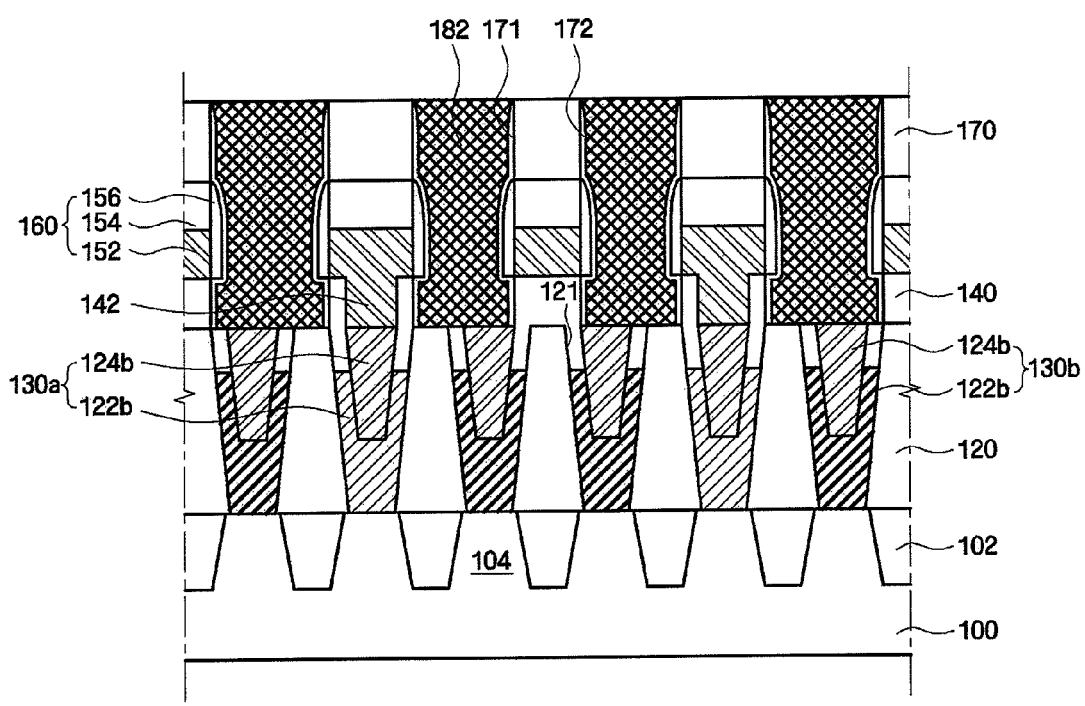

Referring to FIG. 11, after the storage node contact holes 171 are formed, storage node contact spacers 172 are formed on inner walls of the storage node contact holes 171.

For example, a spacer insulation film is conformally formed on a whole surface of the resultant structure of FIG. 10 having the storage node contact holes 171. The spacer insulation film may be formed by depositing, for example, a silicon nitride film (SiN). Then, the etch-back process is performed on the conformally deposited spacer insulation film to form contact spacers 172 on the inner walls of the contact holes 171.

Next, a conductive material or a metal material is filled into the storage node contact holes 171 and then planarized, thereby completing storage node contact plugs 182. The storage node contact plugs 182 may contact and thus be electrically connected to the contact pads 130b and may be insulated from the adjacent contact pads 130a. Consequently, an electric short circuit between the storage node contact plugs 182 and the contact pads 130a due to increased integration density of the semiconductor device can be prevented.

In a semiconductor device and a method of fabricating the same according to exemplary embodiments of the present invention, each contact hole formed in an insulation film includes a plurality of contact pads, each composed of a first contact pad partially filling the contact hole and a second contact pad having a lower part inserted into the first contact pad. In addition, a distance between the first contact pads is greater than a distance between the second contact pads. Accordingly, the distance between the contact pads on a surface of the insulation film can be increased.

Consequently, an insulation margin between the contact pads is increased, thereby preventing an electric short circuit between contact plugs, which are formed on the contact pads, and adjacent contact pads.

Furthermore, the distance between the contact pads can be adjusted by controlling the thicknesses of the first contact pads while being formed. Therefore, the insulation margin between the contact pads can be secured through a simple fabrication process.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
a first insulation film having a plurality of openings which exposes predetermined regions a semiconductor substrate;
a plurality of first conductive patterns partially filling the openings; and
a plurality of second conductive patterns disposed on the first conductive patterns within the openings and separated from inner walls of the openings; and
a second insulation film formed on the first insulation film and extending into the openings in the first insulation film to completely fill the openings, and wherein the second insulation film contacts the first conductive patterns and the second conductive patterns and surrounds the second conductive patterns within the openings.

2. The device of claim 1, wherein the first conductive patterns and the second conductive patterns are made of different materials from each other.

3. The device of claim 2, wherein the first conductive patterns are made of polysilicon, and the second conductive patterns are made of a metal material.

4. The device of claim 1, wherein lower parts of the second conductive patterns are disposed within the first conductive patterns.

5. The device of claim 1, wherein surfaces of the second conductive patterns are on the same plane as a surface of the first insulation film.

6. The device of claim 1, wherein a distance between the first conductive patterns is less than a distance between the second conductive patterns.

7. A semiconductor device comprising:
a first inter-layer insulation film having a plurality of contact holes which exposes predetermined regions of a semiconductor substrate;
a plurality of first contact pads partially filling the contact holes;
a plurality of second contact pads disposed on the first contact pads within the contact holes and separated from inner walls of the contact holes;
a second inter-layer insulation film disposed on the first inter-layer insulation film and extending into the contact holes in the first inter-layer insulation film to completely fill the contact holes, and wherein the second inter-layer insulation film contacts the first contact pads and the second contact pads and surrounds the second contact pads within the contact holes;
a plurality of bitlines disposed on the second inter-layer insulation film and electrically connected to the second contact pads; and
a plurality of contacts formed in the second inter-layer insulation film and electrically connected to the second contact pads between the bitlines.

8. The device of claim 7, wherein the first contact pads and the second contact pads are made of different materials from each other.

9. The device of claim 8, wherein the first contact pads are made of polysilicon, and the second contact pads are made of a metal material or metal silicide.

10. The device of claim 7, wherein lower parts of the second contact pads are disposed within the first contact pads.

11. The device of claim 8, wherein surfaces of the second contact pads are on the same plane as a surface of the first inter-layer insulation film.

* * * * *